United States Patent [19]

Chien et al.

[11] Patent Number: 5,767,534

[45] Date of Patent: Jun. 16, 1998

[54] PASSIVATION CAPPING LAYER FOR OHMIC CONTACT IN II-VI SEMICONDUCTOR LIGHT TRANSDUCING DEVICE

[75] Inventors: Fen-Ren Chien, Maplewood; Michael A. Haase, Woodbury; Thomas J. Miller, Minneapolis, all of Minn.

[73] Assignee: Minnesota Mining and Manufacturing Company, St. Paul, Minn.

[21] Appl. No.: 804,768

[22] Filed: Feb. 24, 1997

[51] Int. Cl.$^6$ ............................... H01L 33/00
[52] U.S. Cl. ................ 257/91; 257/94; 257/103; 257/744
[58] Field of Search .................. 257/91, 94, 99, 257/103, 744

[56] References Cited

U.S. PATENT DOCUMENTS

| | | | |
|---|---|---|---|
| 5,213,998 | 5/1993 | Qiu et al. | 437/185 |
| 5,248,631 | 9/1993 | Park et al. | 437/105 |
| 5,274,269 | 12/1993 | DePuydt et al. | 257/744 |
| 5,291,507 | 3/1994 | Haase et al. | 372/44 |
| 5,319,219 | 6/1994 | Cheng et al. | 257/14 |
| 5,363,395 | 11/1994 | Gaines et al. | 372/45 |
| 5,395,791 | 3/1995 | Cheng et al. | 437/105 |
| 5,396,103 | 3/1995 | Qiu et al. | 257/744 |
| 5,404,027 | 4/1995 | Haase et al. | 257/13 |
| 5,420,446 | 5/1995 | Narui et al. | 257/103 |
| 5,422,902 | 6/1995 | Mensz | 257/201 |
| 5,423,943 | 6/1995 | Narui et al. | 156/643.1 |
| 5,513,199 | 4/1996 | Haase et al. | 372/44 |
| 5,515,393 | 5/1996 | Okuyama et al. | 372/45 |
| 5,538,918 | 7/1996 | Haase et al. | 437/127 |

*Primary Examiner*—Minh-Loan Tran
*Attorney, Agent, or Firm*—Judson K. Champlin; Lorraine R. Sherman

[57] ABSTRACT

A II–VI semiconductor device includes a stack of semiconductor layers. An ohmic contact is provided that electrically couples to the stack. The ohmic contact has an oxidation rate when exposed to an oxidizing substance. A passivation capping layer overlies the ohmic contact and has an oxidation rate that is less than the oxidation rate of the ohmic contact.

46 Claims, 2 Drawing Sheets

PASSIVATION CAPPING LAYER FOR OHMIC CONTACT IN II-VI SEMICONDUCTOR LIGHT TRANSDUCING DEVICE

GOVERNMENT RIGHTS

The United States government has certain rights in this invention pursuant to Contract No. DAAH 04-94-C-0049 awarded by the Defense Advanced Research Projects Agency and the Department of the Army/Army Research Office.

BACKGROUND OF THE INVENTION

The present invention relates to II-VI semiconductor devices such as laser diodes and light emitting diodes. More specifically, the present invention relates to a passivation capping layer for an ohmic contact to a II-VI semiconductor device.

Group II-VI compound semiconductor devices are known. Such devices are useful in constructing light emitting or detecting devices, diodes and laser diodes such as those described in U.S. Pat. No. 5,213,998, issued May 25, 1993; U.S. Pat. No. 5,248,631, issued Sep. 28, 1993; U.S. Pat. No. 5,274,269, issued Dec. 28, 1993; U.S. Pat. No. 5,291,507, issued Mar. 1, 1994; U.S. Pat. No, 5,319,219, issued Jun. 7, 1994; U.S. Pat. No. 5,395,791, issued Mar. 7, 1995; U.S. Pat. No. 5,396,103, issued Mar. 7, 1995; U.S. Pat. No. 5,404,027, issued Apr. 4, 1995; U.S. Pat. No. 5,363,395, issued Nov. 8, 1994; U.S. Pat. No. 5,515,393, issued May 7, 1996; U.S. Pat. No. 5,420,446, issued May 30, 1995; U.S. Pat. No. 5,423,943, issued Jun. 13, 1995; U.S. Pat. No. 5,538,918, issued Jul. 23, 1996; and U.S. Pat. No. 5,513,199, issued Apr. 30, 1996.

Historically, diodes have generated red or infrared light. However, there are many applications where diodes that emit radiation in shorter wavelengths, for example, in the blue and green portions of the spectrum (i.e., at wavelengths between 590 nm and 430 nm) would be useful. Further, such short wavelength laser diodes would increase the performance and capabilities of many existing systems that currently use infrared and red laser diodes.

It is critical to obtain a good electrical contact to the device. Typically, II-VI semiconductor diodes have employed p-type ZnTe ohmic contacts to provide an electrical conductance to p-type layers of a II-VI semiconductor diode. However, the interface between the ohmic contact and the p-type layer is such that the valence band offset is approximately 1 eV. This offset forms a barrier to hole injection. A graded composition alloy layer has been used as a technique to remove this barrier and is described in U.S. Pat. No. 5,396,103. However, there is a large lattice mismatch between the ohmic contact and the other layers of the device which gives rise to an increased density of microstructural defects in the contact region. These defects may play a significant role in degradation of the performance of the device.

SUMMARY OF THE INVENTION

The present invention includes a semiconductor device having a stack of semiconductor layers. A II-VI semiconductor ohmic contact electrically couples to the device and includes beryllium (Be). The ohmic contact has an oxidation rate when exposed to oxidizing environments. A passivation capping layer overlies the ohmic contact and has an oxidation rate which is less than the oxidation rate of the ohmic contact.

DETAILED DESCRIPTION OF THE PREFERRED EMBODIMENTS

Figure 1:
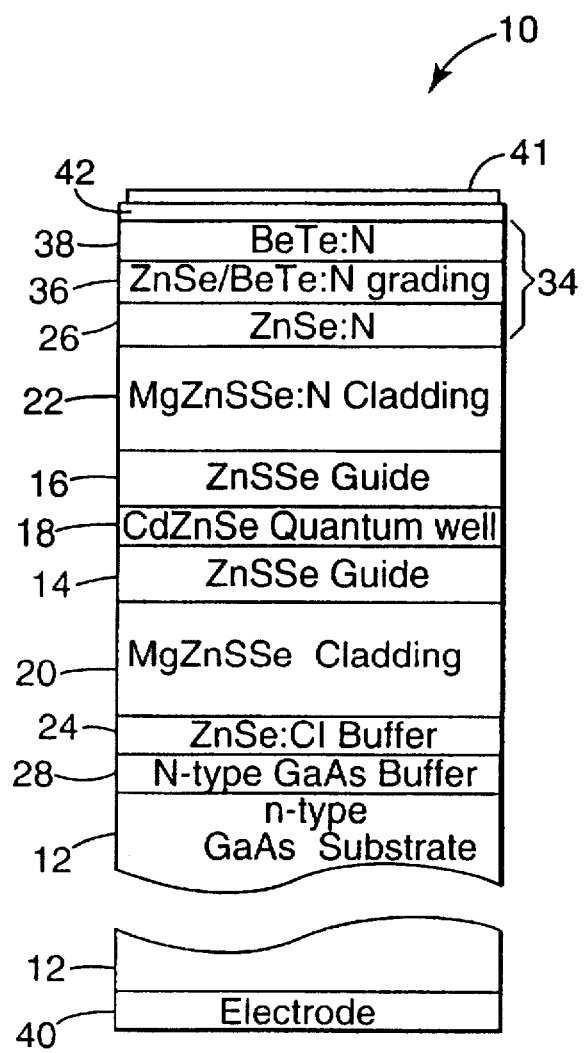
FIG. 1 is a simplified block diagram showing layers of a II-VI semiconductor laser diode in accordance with the present invention.

The structure of a laser diode 10 in accordance with the present invention is illustrated generally in FIG. 1. Laser diode 10 is a wide bandgap II-VI device fabricated from heteroepitaxial layers grown by molecular beam epitaxy (MBE) on a GaAs substrate. Laser diode 10 is fabricated on a GaAs substrate 12 and includes lower (first) and upper (second) ZnSSe light guiding layers 14 and 16, respectively, separated by a CdZnSe quantum well active layer 18. The surfaces of light guiding layers 14 and 16 opposite active layer 18 are bounded by lower (first) and upper (second) MgZnSSe cladding layers 20 and 22, respectively. A lower ZnSe:Cl buffer layer 24 is positioned on the surface of lower cladding layer 20 which is opposite light guiding layer 14. An upper BeTe:N/ZnSe ohmic contact 34 is positioned on the surface of upper cladding layer 22 which is opposite light guiding layer 16.

A GaAs buffer layer 28 separates substrate 12 from lower ZnSe:Cl buffer layer 24 to assure high crystalline quality of the subsequently grown layers. A p-type contact 34 is formed by ZnSe:N layer 26, ZnSe/BeTe:N grading layer 36, BeTe:N layer 38 and ZnTe:N capping layer 42. Electrode 41 is provided for electrical contact to layer 42. Further, an electrode 40 is provided to contact GaAs substrate 12 opposite lower buffer layer 24. Layers 20 and 24 are all doped n-type with Cl (i.e., are of a first conductivity type). Further, layers 22 and 26 are doped p-type with N (i.e., are of a second conductivity type). Active layer 18 is an undoped quantum well layer of CdZnSe or CdZnSSe semiconductor. Layers 12 through 40 provide a "stack of semiconductor layers" in accordance with the present invention.

Figure 2:
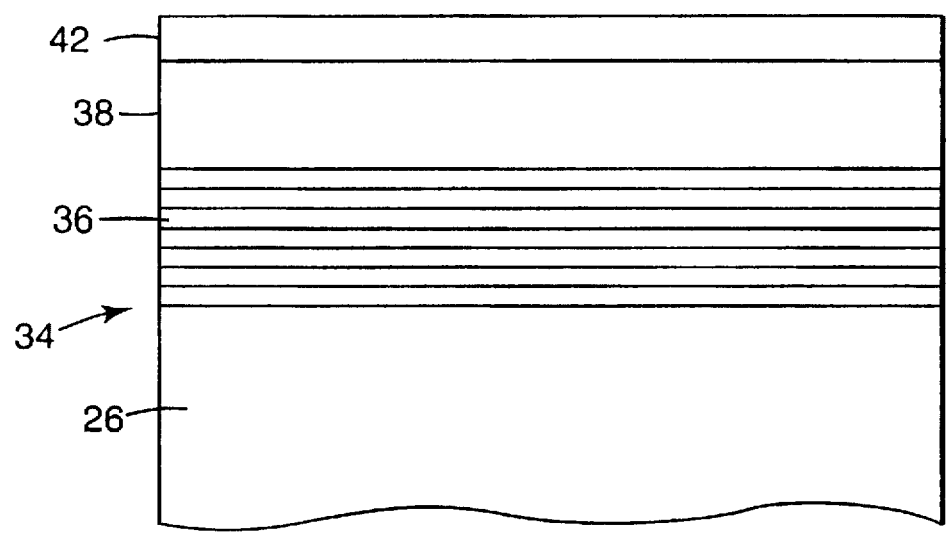
FIG. 2 is a more detailed view of a p-type contact in the semiconductor laser diode shown in FIG. 1.

FIG. 2 is a more detailed version of p-type contact 34 in accordance with the present invention deposited on p-type ZnSe layer 26. As shown in FIG. 2, digitally graded layers 36 comprise a plurality of layers stacked one upon the other. The p-type ZnTe capping layer 42 is deposited upon p-type BeTe layer 38. In accordance with the invention, capping layer 42 has an oxidation rate which is less than the oxidation rate of the BeTe layer 38. Capping layer 42 has sufficient thickness and consistency to completely cover layer 38. Therefore, capping layer 42 protects layer 38 from exposure to air and other oxidizing agents and thereby prevents oxidation of layer 38. Those skilled in the art will recognize that capping layer 42 may be of any appropriate material. ZnTe is selected because it is easily incorporated into the fabrication process of II-VI semiconductor devices. Other suitable capping layer materials include CdSe, HgSe, and most metals.

One common low-resistance p-type ohmic contact to p-ZnSe based layers for II-VI blue-green semiconductor laser diodes is p-ZnTe. The energy band lineup at the p-ZnTe/p-ZnSe interface is such that the valence band offset of approximately 1 eV forms a barrier to hole injection. The commonly used technique to remove the barrier is to introduce a digitally graded Zn(Se,Te) layer between the p-ZnSe and the p-ZnTe. However, the large lattice mismatch of the ZnTe/ZnSe layers gives rise to a high microstructural defect density in the contact regions, and may play a significant role in contact degradation. Since BeTe, with a bandgap of 2.7 eV, is closely lattice-matched to ZnSe and GaAs, a BeTe layer with BeTe/ZnSe digitally graded layers appear an ideal candidate for ohmic contact to p-type ZnSe based semiconductors.

A contact structure has been proposed which includes 200 Å p-BeTe and 300–900 Å p-$Be_xZn_{1-x}Te_ySe_{1-y}$ linearly graded band gap ohmic contact to p-ZnSe which should have superior electrical properties to a p-$ZnTe_xSe_{1-x}$ linearly graded ohmic contact. Due to the small lattice mismatch to p-ZnSe (~0.7%) and GaAs, BeTe and $Be_xZn_{1-x}Te_xSe_{1-x}$ graded bandgap layers provide improved ohmic contacts to p-ZnSe based semiconductors. These contacts will allow for entire II–VI laser structures to be grown pseudomorphically with GaAs substrates. Typically, following the deposition of the BeTe layer, the substrate is removed from the MBE chamber and is exposed to air or other oxidizing agents.

The present invention includes the discovery that BeTe is chemically active in air and tends to react with oxygen to form an amorphous BeO layer.

This oxidation of BeTe in air at room temperature has been experimentally observed using cross-sectional transmission electron microscopy (TEM).

This oxide layer is a potential problem during laser device processing and fabrication. The non-conductive oxide layer limits the efficiency of the laser diode and can also shorten the lifetime of the laser during room temperature continuous wave operation. It is therefore necessary to prevent BeTe surface oxidation in air. The present invention addresses this issue with an electrically conductive capping layer subsequently deposited onto the BeTe surface before the BeTe surface is exposed to air. In one embodiment, the capping layer is a ZnTe layer.

The advantages of the present invention have been observed experimentally. In one experiment, two contacts consisting of 300 Å p-BeTe and 300 Å ZnSe/BeTe digitally graded layers were grown by MBE onto p-ZnSe. A 50 Å capping layer of p-ZnTe was subsequently deposited onto one of the two 300 Å p-BeTe finished surface. The two wafers were then exposed to air for device processing. The two contact structures were characterized by cross-sectional transmission electron microscopy (TEM).

A thin amorphous layer at the top of the uncapped BeTe was observed, while no amorphous layer was observed between the ZnTe capping layer and the BeTe layer. Thus, it has been discovered that BeTe is subject to oxidation even at room temperature in air. On the other hand, a ZnTe capping layer passivated the BeTe surface and no oxide layer was observed. Such BeTe contacts with a ZnTe capping layer have had contact life times under accelerated testing at a current density of 2 kA/cm$^2$ in excess of 600 hr. This compares to ZnTe based contacts which have operated for only 20 hr at 1 kA/cm$^2$.

The invention may employ other materials with relatively high resistance to oxidation that are preferably electrical conductors. For example, p-CdSe, p-CdTe, p-HgS, p-HgSe, etc. can be used as capping layers for BeTe. In addition, ZnSe can be used as a capping layer if the layer is thin enough (up to about 100 Å) for electron tunnelling to occur therethrough. Other materials which are resistive in their bulk form may be selected if they are sufficiently thin to provide electrical conduction. Further, in-situ metal contacts with high work functions, such as Pt, Pd, Ir, Rh, Ni, Co and Au, can be directly deposited onto the BeTe surface without exposure to air to passivate the BeTe surfaces during fabrication. Even lower work function metals are acceptable, for example, Al, Ti, Zn and Cd. It is within the scope of the invention to cap any layer in a II–VI semiconductor which tends to oxidize. Such layers may consist of BE-containing compounds which have been doped p-type or n-type. In the case of an n-doped semiconductor layer, the capping layer would also be doped n-type to achieve good electrical conduction.

Although the present invention has been described with reference to preferred embodiments, workers skilled in the art will recognize that changes may be made in form and detail without departing from the spirit and scope of the invention. As used herein, "stack of II–VI semiconductor layers" includes any layer or grouping of layers including light producing devices, the laser diodes set forth herein or other configurations such as diodes, devices with n-type up, etc. The invention is well adapted for any situation in which an easily oxidized layer of a II–VI device must be exposed to oxidizing agent. Semiconductor devices of the invention are useful as lasers, light emitting diodes, sensors, etc. Devices using semiconductors of the invention include optical communication devices, optical storage, optical read-write devices, etc.

What is claimed is:

1. A semiconductor device, comprising:
   a stack of semiconductor layers;
   an ohmic contact electrically coupling to the stack, the ohmic contact comprising a II–VI semiconductor containing Be and having an oxidation rate when exposed to oxidizing materials; and
   a passivation capping layer overlying the ohmic contact, said capping layer having an oxidation rate which is less than the oxidation rate of the ohmic contact, wherein the passivation capping layer includes ZnTe.

2. The semiconductor device of claim 1 wherein the ohmic contact includes BeTe.

3. The semiconductor device of claim 1 wherein the passivation capping layer is electrically conductive.

4. The semiconductor device of claim 1 wherein the stack of semiconductor layers comprises a II–VI light emitting diode.

5. The semiconductor device of claim 1 wherein the stack of semiconductor layers comprises a II–VI laser diode.

6. The semiconductor device of claim 1 wherein the ohmic contact is doped p-type.

7. The semiconductor device of claim 1 wherein the ohmic contact is doped n-type.

8. The semiconductor device of claim 1 wherein the passivation capping layer is a p-type semiconductor.

9. The semiconductor device of claim 1 wherein the passivation capping layer is doped n-type.

10. The semiconductor device of claim 1 wherein the passivation capping layer is selected from the group consisting of CdSe, CdTe, HgS, HgSe and ZnSe.

11. The semiconductor device of claim 1 wherein the passivation capping layer comprises a metal.

12. The semiconductor device of claim 1 wherein the stack forms a light emitting diode.

13. The semiconductor device of claim 1 wherein the stack forms a laser.

14. An optical data storage system including a semiconductor device in accordance with claim 1.

15. An electronic system including a semiconductor device in accordance with claim 1.

16. A optical communication device including a semiconductor device in accordance with claim 1.

17. A semiconductor device, comprising:
    a stack of semiconductor layers;

an ohmic contact electrically coupling to the stack, the ohmic contact comprising a II–VI semiconductor containing Be and having an oxidation rate when exposed to oxidizing materials; and a passivation capping layer overlying the ohmic contact, said capping layer having an oxidation rate which is less than the oxidation rate of the ohmic contact, wherein the passivation capping layer is doped p-type.

18. The semiconductor device of claim 17 wherein the ohmic contact includes BeTe.

19. The semiconductor device of claim 17 wherein the passivation capping layer includes ZnTe.

20. The semiconductor device of claim 17 wherein the stack of semiconductor layers comprises a II–VI light emitting diode.

21. The semiconductor device of claim 17 wherein the stack of semiconductor layers comprises a II–VI laser diode.

22. The semiconductor device of claim 17 wherein the ohmic contact is doped p-type.

23. The semiconductor device of claim 17 wherein the passivation capping layer is selected from the group consisting of CdSe, CdTe, HgS, HgSe and ZnSe.

24. An optical data storage system including a semiconductor device in accordance with claim 17.

25. An electronic system including a semiconductor device in accordance with claim 17.

26. A optical communication device including a semiconductor device in accordance with claim 17.

27. A semiconductor device, comprising:

a stack of semiconductor layers;

an ohmic contact electrically coupling to the stack, the ohmic contact comprising a II–VI semiconductor containing Be and having an oxidation rate when exposed to oxidizing materials; and a passivation capping layer overlying the ohmic contact, said capping layer having an oxidation rate which is less than the oxidation rate of the ohmic contact, wherein the passivation capping layer is doped n-type.

28. The semiconductor device of claim 27 wherein the ohmic contact includes BeTe.

29. The semiconductor device of claim 27 wherein the stack of semiconductor layers comprises a II–VI light emitting diode.

30. The semiconductor device of claim 27 wherein the stack of semiconductor layers comprises a II–VI laser diode.

31. The semiconductor device of claim 27 wherein the ohmic contact is doped n-type.

32. The semiconductor device of claim 27 wherein the passivation capping layer is selected from the group consisting of CdSe, CdTe, HgS, HgSe and ZnSe.

33. An optical data storage system including a semiconductor device in accordance with claim 27.

34. An electronic system including a semiconductor device in accordance with claim 27.

35. A optical communication device including a semiconductor device in accordance with claim 27.

36. A semiconductor device, comprising:

a stack of semiconductor layers;

an ohmic contact electrically coupling to the stack, the ohmic contact comprising a II–VI semiconductor containing Be and having an oxidation rate when exposed to oxidizing materials; and a passivation capping layer overlying the ohmic contact, said capping layer having an oxidation rate which is less than the oxidation rate of the ohmic contact, wherein the passivation capping layer is selected from the group consisting of CdSe, CdTe, HgS, HgSe and ZnSe.

37. The semiconductor device of claim 36 wherein the ohmic contact includes BeTe.

38. The semiconductor device of claim 36 wherein the passivation capping layer is electrically conductive.

39. The semiconductor device of claim 36 wherein the stack of semiconductor layers comprises a II–VI light emitting diode.

40. The semiconductor device of claim 36 wherein the stack of semiconductor layers comprises a II–VI laser diode.

41. The semiconductor device of claim 36 wherein the ohmic contact is doped p-type.

42. The semiconductor device of claim 36 wherein the ohmic contact is doped n-type.

43. The semiconductor device of claim 36 wherein the passivation capping layer is doped n-type.

44. An optical data storage system including a semiconductor device in accordance with claim 36.

45. An electronic system including a semiconductor device in accordance with claim 36.

46. A optical communication device including a semiconductor device in accordance with claim 36.

* * * * *